(12) United States Patent
Greenberg et al.

(10) Patent No.: US 9,431,085 B2
(45) Date of Patent: Aug. 30, 2016

(54) MOST ACTIVATED MEMORY PORTION HANDLING

(71) Applicant: Synopsys, Inc., Mountain View, CA (US)

(72) Inventors: Marc Adam Greenberg, Austin, TX (US); Gokhan Gultoprak, Blanchardstown (IE)

(73) Assignee: Synopsys, Inc., Mountain View, CA (US)

( * ) Notice: Subject to any disclaimer, the term of this patent is extended or adjusted under 35 U.S.C. 154(b) by 49 days.

(21) Appl. No.: 14/229,225

(22) Filed: Mar. 28, 2014

(65) Prior Publication Data

US 2015/0279441 A1    Oct. 1, 2015

(51) Int. Cl.
*G11C 11/406* (2006.01)
*G11C 15/00* (2006.01)
*G11C 11/408* (2006.01)

(52) U.S. Cl.
CPC ............ *G11C 11/406* (2013.01); *G11C 11/408* (2013.01); *G11C 15/00* (2013.01)

(58) Field of Classification Search
CPC .......... G11C 11/40622; G11C 11/406; G11C 11/408
See application file for complete search history.

(56) References Cited

U.S. PATENT DOCUMENTS

| | | |
|---|---|---|
| 2002/0067632 A1 | 6/2002 | Batson et al. |
| 2006/0262612 A1 | 11/2006 | Lovett |
| 2008/0140925 A1 | 6/2008 | Lee et al. |
| 2014/0003173 A1 | 1/2014 | Ku |
| 2014/0006703 A1 | 1/2014 | Bains et al. |
| 2014/0006704 A1 | 1/2014 | Greenfield et al. |
| 2014/0059287 A1 | 2/2014 | Bains et al. |
| 2014/0085995 A1 | 3/2014 | Greenfield et al. |
| 2014/0089576 A1 | 3/2014 | Bains et al. |
| 2014/0095780 A1 | 4/2014 | Bains et al. |
| 2014/0156923 A1 | 6/2014 | Bains et al. |

OTHER PUBLICATIONS

Teledyne LeCroy Press Release. "Teledyne LeCroy Upgraded DDR Protocol Analyzer adds 'Row Hammer' Reporting and System Memory Mapping." Santa Clara, CA. Sep. 4, 2013.
International Search Report dated Jun. 17, 2015 for PCT/US2015/023201.

*Primary Examiner* — Douglas King
(74) *Attorney, Agent, or Firm* — Adams Intellex, PLC

(57) ABSTRACT

Activation of portions of a memory is tracked to allow an affected portion of the memory to be refreshed before it is corrupted by multiple activations. An address for the accessed portion of memory, called the aggressor row, is compared to addresses stored in a content addressable memory (CAM). If the address is not already stored in the CAM, it is stored, casting out another address if necessary, and a count based on an Others value is stored in the CAM with the address. If the address is already stored in the CAM, its associated count is incremented. If a count associated with an address exceeds a threshold based on a maximum activation count, another portion of memory, such as a victim row of memory adjacent to the aggressor row of memory, is refreshed, and the count reset.

32 Claims, 10 Drawing Sheets

MOST ACTIVATED MEMORY PORTION HANDLING

FIELD OF ART

This application relates generally to semiconductor memories and more particularly to tracking activity in portions of a memory.

BACKGROUND

There are many different types of semiconductor memories. Some semiconductor memories, commonly known as read-only memories (ROMs), have data stored in them once, and then the data cannot be changed, but can be read any number of times. Some types of semiconductor memory, including ROMs, are non-volatile and will hold stored data even in the absence of power. Although the data in a true ROM cannot be changed once it is stored, many types of non-volatile memory allow the data stored within them to be changed, although in some cases, there are limitations on how many times data can be changed or limitations on how the data is changed. Examples of non-volatile semiconductor memory include, but are not limited to, electrically erasable programmable read-only memory (EEPROM), NAND flash memory, NOR flash memory, phase-change memory (PCM), and ferroelectric memory (FeRAM).

Other types of memory are volatile and will lose the data stored within them if power is lost. Examples of volatile memory include, but are not limited to, registers, latches, static random access memory (SRAM) with multiple transistors per memory cell, and dynamic random access memory (DRAM) with a single transistor and a capacitor for each memory cell. Typically, a memory cell within a DRAM stores an amount of charge on the capacitor within the memory cell to indicate whether a binary '0' or a binary '1' is stored in the memory cell. In most DRAM architectures, the amount of charge stored in the capacitor may slowly change over time, which if left unchecked, would cause the data stored in the cell to change. This potential cause of memory corruption can be avoided by refreshing the cell on a regular basis to reset the amount of stored charge to the correct amount to preserve a correct value for the stored data. The time between refreshes must be rapid enough to preserve the cell's data value, to not allow transistor leakage to change the value before the next refresh of the cell is completed.

Some DRAMs, including double-data-rate (e.g. DDR3 and DDR4) and low-power DDR (LPDDR4) devices largely conforming to the joint electron device engineering council (JEDEC) standards for such devices, have an internal organization that is partitioned into regions commonly known as banks, pages or a subset of the memory. Pages are further divided into rows and columns, where a single memory cell is identified as being in one particular row and one particular column within the page. To access the data contained within a particular page, row, and column, address decoders specify the page and row to be activated, and then one or more columns are accessed with the activated page and row.

While semiconductor memory devices have been improved over the last several decades to reliably store large amounts of data, there are many different ways that data stored in a semiconductor memory can be corrupted. Many types of manufacturing defects can cause the reliability of memory to be compromised; alpha particles can impact a cell and cause errors; and, in some memories, certain data patterns can cause errors, to name a few. Some memory devices have a property where repeated activation of one region, such as a memory row, can corrupt the data stored in a nearby region, such as an adjacent row. This property is sometimes referred to as "row hammering."

SUMMARY

To prevent data corruption caused by row hammering, activation of memory portions is tracked to allow another portion of the memory to be refreshed before it is corrupted by multiple activations. An address for the accessed portion of memory, such as an aggressor row of memory, is compared to addresses stored in a content addressable memory (CAM). If the address is not already stored in the CAM, the address is stored in the CAM, casting out another address if necessary, and a count based on an Others value is stored in the CAM with the address. If the address is already stored in the CAM, its associated count is incremented. If a count associated with an address exceeds a threshold based on a maximum activation count, another portion of memory, such as a victim row of memory adjacent to the aggressor row of memory, is refreshed, and the count reset.

An apparatus for activation tracking is disclosed comprising: calculating logic for determining a number of times that a portion of a memory has been accessed; storage memory, coupled to the calculating logic, for storing the number of times that the portion of a memory has been accessed as well as an address for the portion; threshold logic, coupled to the calculating logic, for determining that the number of times that the portion is accessed exceeds a certain threshold; and marking logic, coupled to the calculating logic, for defining that a second portion of the memory needs refresh, based on the number exceeding the certain threshold. In embodiments, the storage memory comprises a content addressable memory. A neighboring row to the aggressor row can be determined to be a victim row, wherein the second portion of memory comprises the victim row. A certain threshold can be a maximum activation count divided by a number of victim rows affected by the aggressor row. The second portion of the memory can be refreshed by writing data into the second portion.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Configuration Overview

Figure 1:
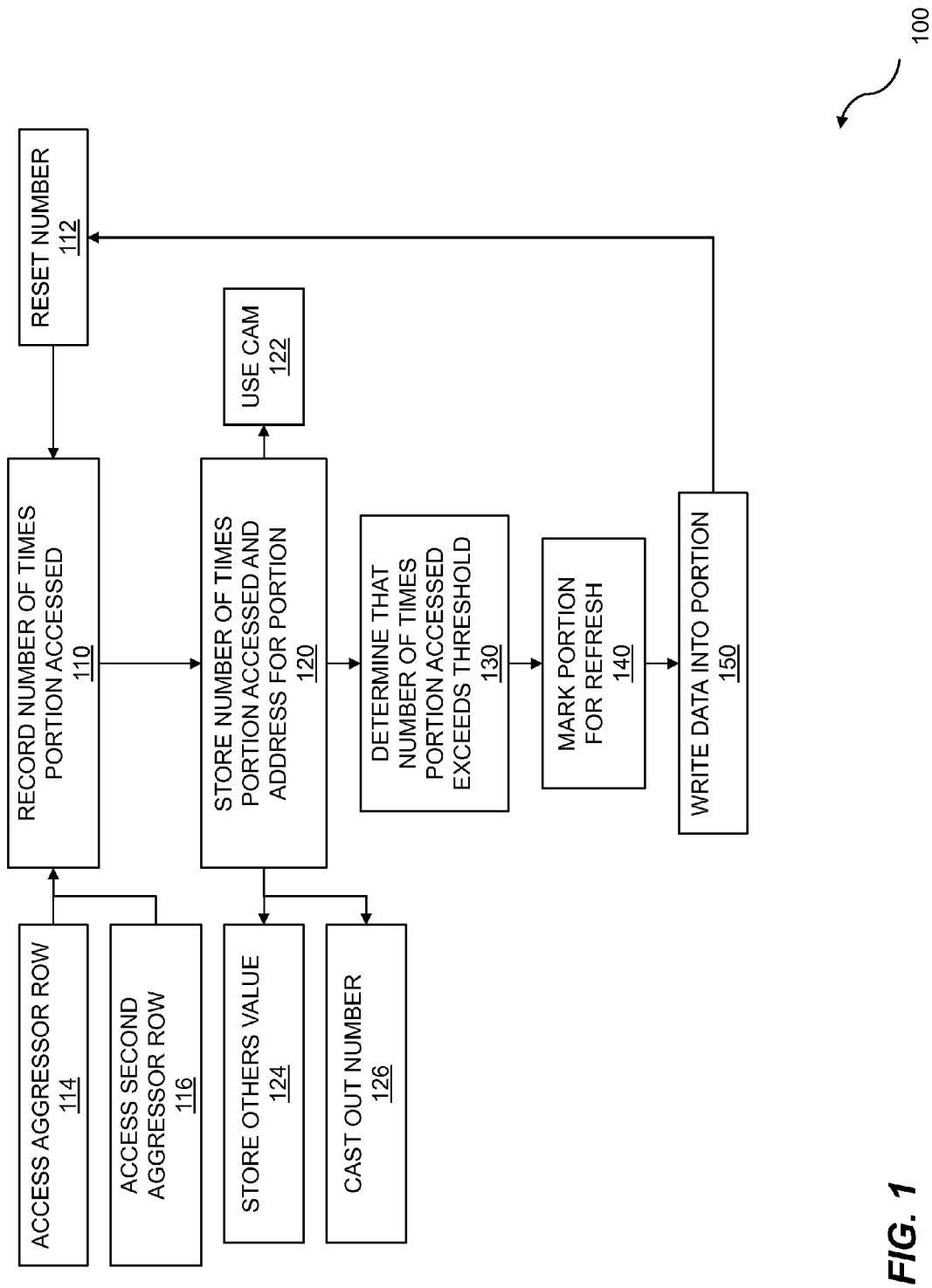
FIG. 1 is a flow diagram for activation tracking.

Some types of semiconductor memories, such as, but not limited to, DDR3, DDR4 and LPDDR4 devices largely confirming to the JEDEC standards for such devices, can be susceptible to data corruption due to row hammering. Row hammering is characterized by repeated access to a row of memory, called the aggressor row, causing data corruption in an adjoining or nearby row of memory, known as the victim row. Data corruption due to row hammering can be avoided by ensuring that the number of activations of an aggressor row does not exceed a maximum activation count (nMAC) before nearby rows are refreshed.

Conceptually, a counter could be maintained for each row in a memory, and once a counter for one row was incremented to be equal to nMAC, the rows near that row could be refreshed using a targeted row refresh (TRR) command or other method to refresh the nearby rows. Once the nearby rows are refreshed, the counter that caused the refresh could be reset to zero.

While such an algorithm might be practical for memories with a small number of rows, and would prevent data corruption of a victim row which has been partially degraded by the repeated activation of a nearby aggressor row, commonly available DRAM devices can have tens of thousands of rows or more. As an example, one particular 8G×4 DDR4 device has 2,097,152 rows in its memory architecture. It would therefore be very expensive in terms of die area and gate count to implement a counter for each row, making it impractical for commercially viable modern memory devices.

A method for activation tracking is described herein, along with circuits, apparatus, systems, and computer program products, which provide a similar effect to keeping a counter for each row of memory, without the huge amount of die area that would be required to provide a separate counter for each row of memory. The most activated areas of a memory are tracked so that action can be taken to avoid data corruption near those highly activated areas. The action taken could include, but is not limited to, pausing memory access entirely, pausing memory access to the affected rows, copying the affected rows to a different location in memory, rewriting data into the affected rows, issuing extra refresh commands, issuing targeted row refresh commands, issuing general repair commands, or some other method.

In one embodiment, a content addressable memory (CAM), also called an associative array, is provided along with the memory array. Depending on the embodiment, the CAM can be implemented fully within hardware, with finite state machines controlling the operation of the CAM; can be deployed as a hybrid CAM with portions of the CAM implemented in hardware and other portions implemented using software, firmware, or microcode running on a controller, processor, or other type of computational engine; or as a soft CAM that uses a portion of the main memory array or a separate memory array or device and the is controlled entirely by software running on a processor. In some embodiments, the CAM is a part of a separate memory controller that is responsible for controlling one or more memory devices, but in other embodiments the CAM is integrated into a memory device to transparently track row activations for that memory device and refresh potentially degraded rows as necessary.

Each entry in the CAM includes an address component to identify a row of the memory and a data component to store a count of the number of times the row has been activated. An Others register that records the highest number of times that any row whose address is not stored in the CAM has been activated over an arbitrary time period is also included. In this embodiment, the number of activates of all the rows in the device over time are tracked using a relatively small number of memory storage locations. For example, in this embodiment, the CAM individually tracks the number of activates for each of the most activated rows, and tracks the lesser activated rows as a group by recording the highest number of activates for any row of the group in the Others register. While this embodiment tracks rows within the memory, other embodiments track other portions of the memory, such as columns, regions within a bank, pages, or any other subset of the memory.

In one embodiment, a CAM consisting of N entries is provided, with each entry including an address part to hold a row address and a data part to hold a counter for the number of times the row identified in the address part has been activated. The number of bits of data for each part is dependent on the embodiment, with the number of bits for the address part dependent upon the number of rows in the memory and the number of bits for the data part dependent upon the maximum activation count (referred to as nMAC) for the memory. The Others register has a number of bits that is also dependent upon nMAC.

Each time a memory row is activated, the address of the row is checked against the address entries in the CAM. If the address of the row is found in the address part of the CAM, then the data part of the corresponding address part is checked. If the data part is less than a threshold, which is equal to nMAC in at least one embodiment, then the data part is incremented. If the data part is found to be at or above the threshold, then corrective action is taken to prevent corruption of nearby rows of memory or to alert some system supervisory function that the threshold has been exceeded for that row. If corrective action is taken and the corrective action has the effect of nullifying the degradation of the victim rows, then that row address can be removed from the address part of the CAM. In another embodiment, the row address is left in the address part of the CAM and the corresponding data part is set to a value based on the value in the Others register.

In some embodiments, a value less than nMAC is used as the threshold for corrective action. In some embodiments, an access action for one aggressor row can impact more than one victim row, so the value used as the threshold can be based on nMAC divided by the number of victim rows associated with one aggressor row. As an example, if an access to an aggressor row can affect a victim row on either side of the aggressor row, nMAC/2 can be used as the threshold.

If the address of the row is not found in the address part of the CAM, and there are unused entries in the CAM, then the address of the row being activated is added to the address part of the CAM and the corresponding data part of the CAM is set to the value of the Others register plus one. If the address of the row is not found in the address part of the CAM and there are no unused entries in the CAM, then the data part of the CAM that has the lowest value is found. If there are multiple entries equal to the lowest-valued entry, then any CAM entry with the data part equal to the lowest value can be chosen, although some embodiments will select the oldest or least recently used entry in the CAM with a data part equal to the lowest-valued data part. Once an entry in the CAM with the lowest-value data part has been identified, the Others register is set to a value equal to the lowest-value data part. The selected entry of the CAM is then updated so that the data part set to the lowest value data part plus one, the address part is set to the address of the row being activated.

In embodiments, the activate counts stored in the data portions of the CAM are periodically decremented, expired, or otherwise made to compensate for any self-healing nature of the memory device or repairs to degraded areas of memory that are caused by other memory process such as refresh, for example. Different embodiments accomplish the decrementing or flushing of outdated activation counts using different methods. In a device where all rows in the device are refreshed within a time period defined as tREF, one embodiment sets a time threshold for taking action based on a row being activated nMAC/2 times. In that embodiment, the data portion of the CAM is cleared, along with the Others register, periodically with a period of tREF/2. This ensures that action is taken for a row before it has been activated more than nMAC times, even if the data portion in the CAM for that row is at nMAC/2−1 right before it is cleared each time. The normal refresh will refresh that row and its nearby rows by the time the CAM is cleared the second time. Alternatively, if one aggressor row can impact two different victim rows, the threshold can be set to nMAC/4 with the CAM being cleared periodically with a period of tREF/2. In another embodiment, a list of incoming commands is stored for delayed processing. Action can then be taken for a row before nMAC is exceeded based on the queued commands.

Further Details

FIG. 1 is a flow diagram for activation tracking. The flow 100 describes a method for activation tracking and includes recording a number of times that a portion of a memory is accessed 110. The method can be used with any type of memory, including various types of dynamic memory where the data value stored in a memory cell is dependent upon an amount of charge on a capacitor in the memory cell. So in at least some embodiments, the memory can be a dynamic random access memory (DRAM), including, but not limited to, a synchronous DRAM (SDRAM), double data rate DRAM such as DDR3, DDR4, low-power DDR memory such as LPDDR4, or any other type of DRAM.

As used herein, the concept of recording a number of times that a portion of a memory is accessed can be interpreted to mean that a number is stored that is no less than the number of times that a particular portion of memory has been accessed over a particular period of time. While an exact number of accesses can be tracked for some portions of memory for some embodiments, other embodiments will not track an exact number of accesses for all portions of the memory, but instead use a number that is no less than the number of accesses for a particular portion of memory in place of an actual number of accesses to that particular portion of memory since a previous point in time. The previous point in time from which accesses are tracked can be the same for all portions of memory, or can be different for different portions of memory. The way this is done depends on the embodiment, but some embodiments can reset the number of tracked accesses to zero, or some other positive number, for all portions of the memory, on a periodic basis based on the refresh period, or can reset the number for a particular portion of memory in response to a refresh or write to that portion of memory or to a related portion of memory.

The portion of the memory being tracked can be any portion of the memory, depending on the architecture of the memory and the embodiment. In at least one embodiment, the portion of the memory is a row. In another embodiment, the portion being tracked is a group of rows. In some cases, a row can be included in more than one group being tracked. In other embodiments, other portions of the memory can be tracked including, but not limited to, a two-dimensional region of a memory array, a page, a column, a bank, a stack of cells within a three-dimensional array, a plane of a three dimensional array, or a three-dimensional region of a three dimensional array.

In an embodiment, an access to an aggressor row 114 occurs, where the aggressor row is included in the portion of memory. An access to an aggressor row can impact the charge stored in memory cells of one or more victim rows due to parasitic capacitance or other electrical effects. The switching of the row line of the aggressor row couples to memory cells of the one or more victim rows and can either add charge or remove charge from one or more of those memory cells, degrading the charge and potentially leading to memory errors. In some embodiments, an aggressor row impacts victim rows that are adjacent to the aggressor row, and in at least one embodiment, an aggressor row impacts the two victim rows physically located on either side of the aggressor row. Depending on the embodiment of the memory, the aggressor portion of memory being accessed can impact victim portions of the memory, portions that can be defined by a different physical or logical coupling mechanism. It should also be pointed out that access to a first row can create a reciprocal relationship, in which the first row acts as an aggressor row and impacts a second victim row, but the second "victim" row can in turn serve as a second aggressor row that when accessed 116 can act as an aggressor row and impact the first row as a victim row.

A maximum activation count (nMAC) is determined for the memory being accessed. The nMAC can be determined by any method, including, but not limited to, simulation, design calculations, design qualification testing, manufacturing lot testing, or testing of the individual memory device. In one embodiment, nMAC defines a maximum number of times that a single a portion of memory, such as a single aggressor row, can be accessed before a memory cell of any other portion of memory, for example the memory cells within a victim row, has an unacceptable probability of being degraded enough to cause data stored in the memory cell to be incorrectly read. In another embodiment, nMAC defines a maximum number of times that any combination of aggressor portions of memory for a single victim portion of memory, such as two aggressor rows adjacent to a single victim row, can be accessed before a memory cell of the single victim portion of memory has an unacceptable probability of being degraded enough to cause the data bit stored in the memory cell to be incorrectly read when accessed.

An identifier of that portion of the memory being accessed is determined, such as an address, or a portion of an address, for example, a row address. The flow 100 continues with storing the number of times that the portion is accessed as well as an address for the portion 120. The storing can be done in many different ways depending on the embodiment, such as storing access information within a separate memory or a portion of the DRAM, but in some embodiments, storing is accomplished using a content addressable memory (CAM) 122. The CAM can be of any size, but in some embodiments, the CAM has fewer entries than the number of portions of memory being tracked. In at least one embodiment, the CAM includes an address part where the row address is stored, and a data part where the number of times the row has been accessed is stored. The number of bits in the address part of each CAM entry is dependent upon the number of portions of memory being tracked, or the number of address bits used to identify each portion, such as the number of row address bits. The number of bits in the data part of each CAM entry is dependent upon the magnitude of the maximum activation count (nMAC), with the number of bits in the data part being at least enough to represent the value of nMAC.

In some embodiments, the flow 100 includes storing an Others value 124 where the Others value defines the maximum number of times that portions of the memory without specifically stored addresses have been accessed. For example, if there are 256 rows of memory being tracked, and 60 of those rows have an individually stored address and number of accesses stored individually in the CAM, the Others value, in at least one embodiment, stores a maximum number of times that that any one of the other 196 rows have been accessed, where none of the 196 row addresses under observation are individually stored. In at least one embodiment, the Others value has the same number of bits of storage as the data part of each CAM entry.

In response to an access, the row address of that access is presented to the CAM. The CAM then checks to see if that row address is stored in the address part of any entry of the CAM. If the row address is found, the count stored in the data portion of the CAM entry is retrieved, incremented, and stored back in the same entry of the CAM associated with the row address. If the CAM does not already have the row address stored in the address part of any entry of the CAM, and there is an unused entry in the CAM, the identified row address is stored in the address part of the previously unused entry of the CAM and a value based on the Others value is stored in the data part of the same previously unused entry. In at least one embodiment, a value equal to Others+1 is stored in the data part of the CAM associated with that row address.

If the CAM does not already have that row address stored in the address part of any entry of the CAM, and there are no unused entries in the CAM, then a check is made for the lowest value stored in the data part of any CAM entry. In one embodiment, if the lowest value stored in the data part of any CAM entry is greater than the Others value, the Others value is simply incremented by one, and the address of the row being accessed is not stored. In another embodiment, a CAM entry is identified for replacement when an entry having a data part equal to the lowest value of the data parts of entries stored within the CAM is discovered. In this situation, the address of the row being accessed is stored in the address part of the identified CAM entry. A value of Others+1 is stored in the data part of the identified CAM entry, and then the Others value is then set to the lowest value which has been previously found in the data part of any CAM entry. Thus, the flow 100 can include casting out a number 126 from the CAM in response to sufficient other portions of the memory having been accessed more times.

The flow 100 includes determining that the number of times that the portion has been accessed exceeds a certain threshold 130. In some embodiments, the portion of the memory determined to have been accessed more times than the number of accesses set as a threshold is considered an aggressor row. In some embodiments, the value stored in the data portion of an entry of the CAM is compared to the certain threshold after it has been retrieved and incremented but before it is stored back into the data portion of a CAM entry. In some embodiments, the value stored in the data portion of an entry of the CAM is compared to the certain threshold after it is stored in the data portion of a CAM entry. In some embodiments, a separate process takes place which accesses the CAM to compare the data portion of the CAM entries to the certain threshold. The certain threshold varies between embodiments but is based on nMAC in at least some embodiments. In at least one embodiment, the certain threshold is equal to nMAC minus a fixed guard band value, where the guard band value can be any number greater than or equal to zero. In at least one embodiment, the certain threshold is based on nMAC and the number of victim rows that a single aggressor row affects (#VR), such as nMAC/#VR. In other embodiments, the certain threshold is equal to nMAC minus a variable guard band value, where the guard band value starts at zero and increases over time to accommodate aging of the device. In some embodiments, the certain threshold is based on the address of the accessed portion, in order to take physical location of the accessed portion into account.

The flow 100 includes marking a second portion of the memory for refresh 140 based on the number of accesses exceeding the certain threshold. So in some embodiments, once a number of accesses stored in the data part of a particular entry of the CAM is found to exceed the certain threshold, a victim portion that can be impacted by the accesses to the identified portion of the memory. The location of the identified portion is stored in the address part of the CAM entry, allowing the physical location of victim portions to be determined. The victim portion can be one victim row in some embodiments, but in other embodiments can be the two victim rows adjacent to the single aggressor row address as stored in a particular CAM entry. Various embodiments can identify the second portion, or victim portion, as any portion of the memory, depending on the characteristics of the memory and the portion of the memory identified as having been accessed a number of times exceeding a certain threshold. In at least one embodiment, the second (victim) portion includes the accessed (aggressor) portion.

Once the second portion, or victim portion, has been identified, it is marked. The marking can include setting flags associated with the second portion, queuing commands targeting the second portion, generating an access, such as a write, to the second portion, or any other action that can be associated with the second portion or a larger portion of the memory that includes the second portion. In at least one embodiment, the marking comprises refreshing the second portion. Depending on the embodiment, refreshing the second portion can be accomplished by generating one or more refresh commands for the second portion, writing data into the second portion 150, or other actions that correct a charge level of a capacitor of at least one memory cell in the second portion of the memory.

In some embodiments, once the victim portions for an aggressor portion have been marked for refresh, the number of times that the aggressor portion has been accessed is reset, so the flow 100 can include resetting the number 112 in response to the second portion of the memory being refreshed. In at least one embodiment, the number is reset by storing the Others value in the data part of the CAM entry that includes the address of the aggressor portion. In other embodiments, the CAM entry that contains the address of the aggressor portion is marked as empty to reset the number. Various steps in the flow 100 may be changed in order, repeated, omitted, or the like without departing from the disclosed concepts.

Figure 2:
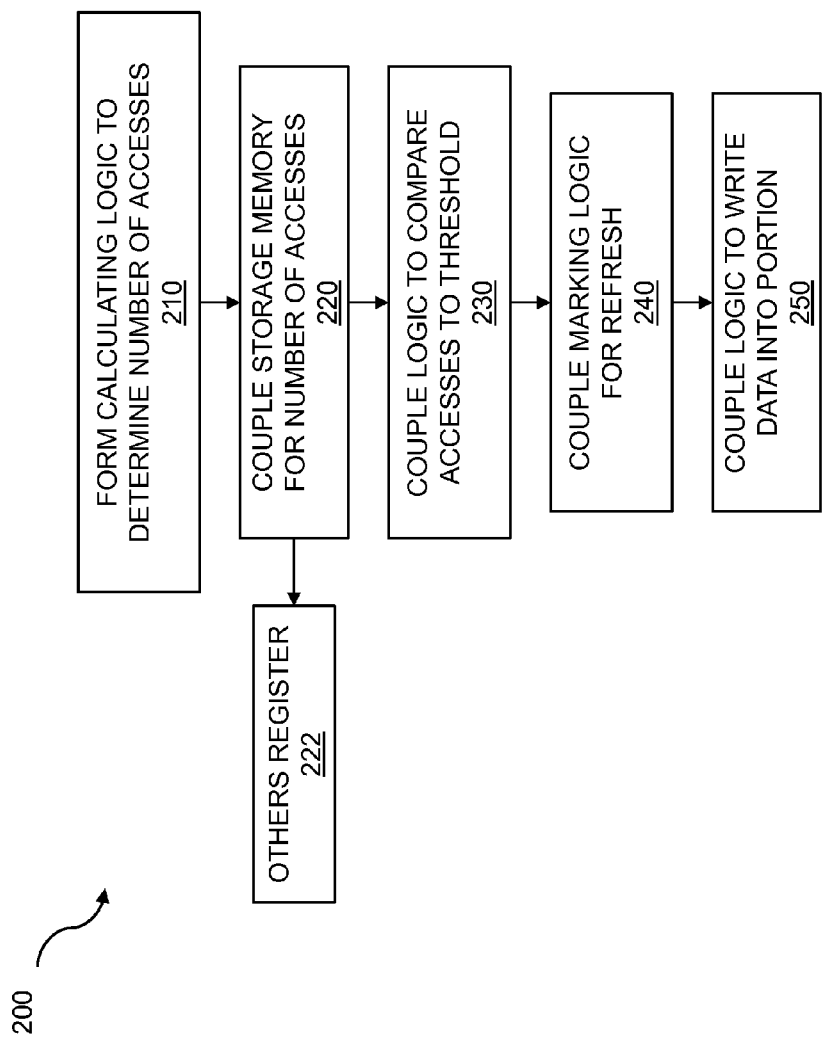
FIG. 2 is flow diagram for address marking.

FIG. 2 is a flow diagram for address marking. The flow 200 describes one embodiment for address marking and includes forming calculating logic 210 to determine a number of accesses to an aggressor row and coupling storage memory for storing the number of accesses 220 to the calculating logic. The calculating logic can be implemented as a finite state machine, a sequencer interpreting microcode, a processor executing software instructions, or any combination thereof, including any combination of electronic circuitry and microcode, firmware, and/or software instructions. The storage memory can be any type of storage memory, including, but not limited to a content addressable memory (CAM) circuit, a separate CAM device, a bank of registers, a separate memory structure constructed using any type of memory architecture, or a portion of the memory that is being accessed.

The calculating logic can also maintain an Others register 222. The Others register can be implemented as a separate register or memory structure, or as a location in the storage memory or the memory that is being accessed, depending on the embodiment. The calculating logic uses the Others register to store a value representing a maximum number of times that any row whose address is not stored in the storage memory has been accessed.

The calculating logic, in response to an access to an aggressor row, determines if the aggressor row address is stored in the storage memory, and if it is, the number associated with the aggressor row address in the storage memory is incremented by one. If the aggressor row address is not already stored in the storage memory, the aggressor row address can be stored in a previously unused location the storage memory, can replace an existing row address stored in the storage memory, or can be discarded, depending on the embodiment and the values already stored in the storage memory. For embodiments that discard the aggressor row address, the Others register is incremented in response to discarding the aggressor row address. If an existing row address is replaced, or is the aggressor row address being stored in a previously unused location in the storage memory, a value equal to Others+1 is stored in the storage memory, associated with the aggressor row address, and the value that was associated with the row address being replaced in the storage memory is stored in the Others register.

The flow 200 continues with coupling logic designed to compare counts of accesses to a threshold 230 stored within the storage memory, and coupling marking logic for refresh 240 to the logic to compare. In some cases the logic to compare can be integrated with the calculating logic and/or the marking logic. The logic to compare retrieves the number of times that rows have been accessed from the storage memory and/or from the calculating logic, and if they exceed a threshold, communicates the exceeding to the marking logic. The marking logic performs a marking action associated with a refresh of a second portion of memory comprising the victim row impacted by the aggressor row. In some embodiments, the flow 200 couples logic to write data into the second portion of memory 250, because the second portion of the memory can be refreshed by writing data into the second portion. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

Figure 3:
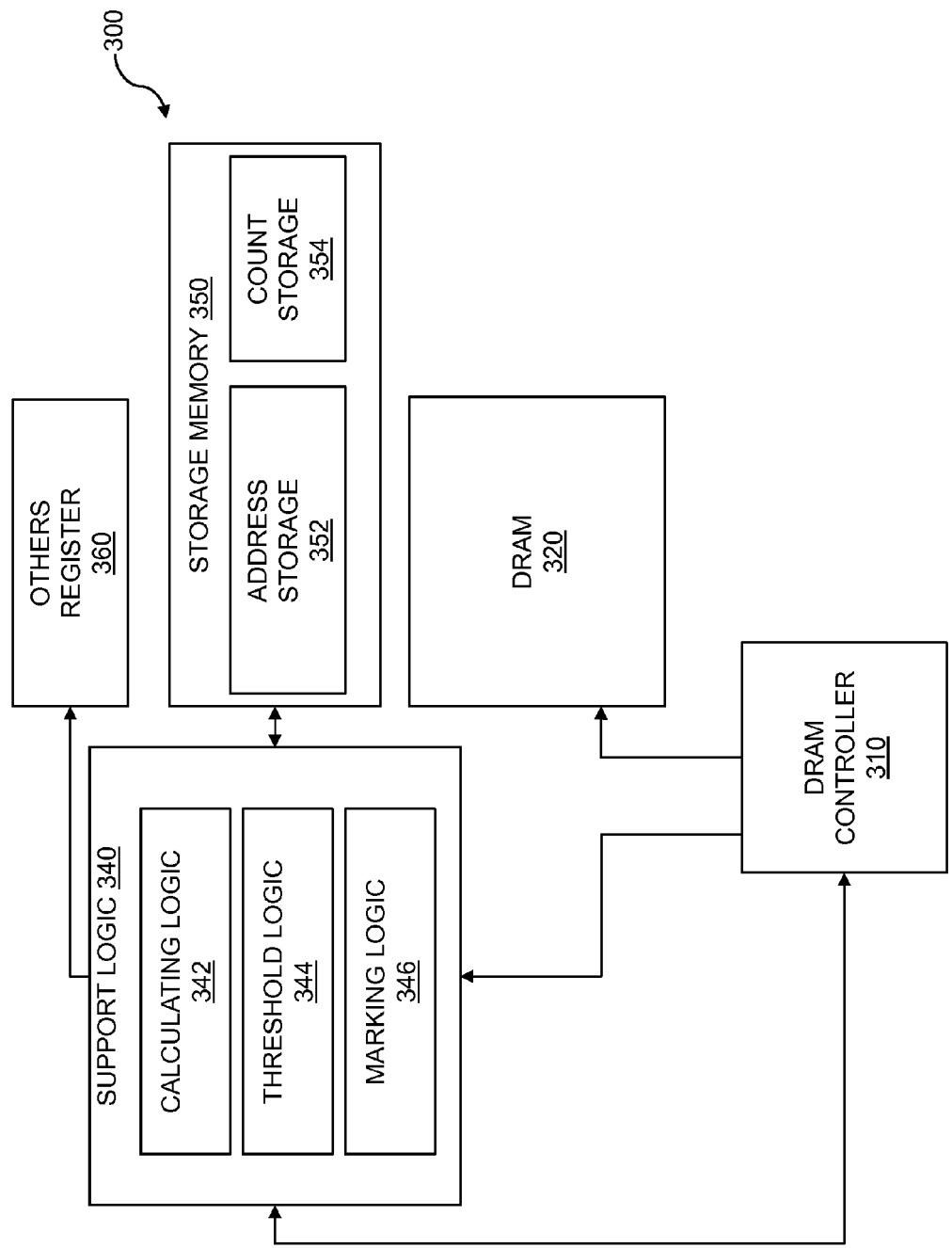
FIG. 3 shows architecture for DRAM/CAM configuration.

FIG. 3 shows architecture for DRAM/CAM configuration. The diagram 300 describes an embodiment of an apparatus for activation tracking. The diagram includes a DRAM controller 310 to control the DRAM 320. The DRAM controller 310 can interact with the DRAM 320 in many different ways, including one or more of writes, reads, or refreshes of the DRAM 320. The DRAM controller 310 receives a signal requesting access to the DRAM 320 and communicates with the DRAM 320 to perform the requested operation and generate a row address that is also sent to the support logic 340. The support logic 340 includes circuitry to support activation tracking.

The support logic 340 can include calculating logic 342 for determining a number of times that a portion of a memory has been accessed; threshold logic 344, coupled to the calculating logic 342, for determining that the number of times that the portion is accessed exceeds a certain threshold; and marking logic 346, coupled to the calculating logic 342, for defining that a second portion of the memory needs refresh, based on the number exceeding the certain threshold. In at least one embodiment, the calculating logic 342, threshold logic 344, and marking logic 346, are integrated into a single unified circuit for the support logic 340. In some embodiments the support logic is partitioned into multiple circuits matching the blocks 342, 344, and 346 as shown. In various embodiments the support logic 340 is partitioned into one or more circuits that can include additional functionality, such as the DRAM controller 310, where any circuit can contain any combination of electronic hardware, microcode, firmware and/or software.

The apparatus 300 can include storage memory 350 coupled to the calculating logic 342, for storing the number of times that the portion of a memory has been accessed as well as an address for the portion. The storage memory 350 includes address storage 352 and count storage 354 where an entry of the storage memory includes one entry in the address storage 352 and one entry in the count storage 354. In some embodiments, the storage memory comprises a content addressable memory (CAM).

In some embodiments, the storage memory has fewer entries than a number of row addresses for the memory, where the memory can comprise a dynamic random access memory (DRAM) 320. The apparatus 300 can include an Others register 360 where an Others value is stored that describes a number of times that other portions of the memory have been accessed where addresses for those other portions are not stored.

The functionality of the support logic 340 is described in detail in the discussion of FIG. 2, but in some embodiments, the calculating logic 342 can use a value stored in the storage memory 350 to increment the value. The value that was incremented can be stored in the storage memory to represent the number of times that a portion of the memory has been accessed. The portion of the memory can be a row in the DRAM 320 and the row being accessed can be determined to be an aggressor row. An access to the aggressor row can have an impact on a second portion of memory. In some embodiments, a neighboring row to the aggressor row can be determined to be a victim row, wherein the second portion of memory comprises the victim row, and in some embodiments, a second neighboring row to the aggressor row can be determined to be a second victim row, wherein the second portion of memory comprises the second victim row.

The support logic 340 can perform various other actions. For example, the number and the address can be cast out of the storage memory 350 by the calculating logic 342 in response to other portions being accessed more times. As another example, the calculating logic 342 can reset a number stored in count storage 354 and associated with an aggressor row address stored in address storage 352 in response to the second portion of the memory being refreshed in response to action by the marking logic 346.

Figure 4:
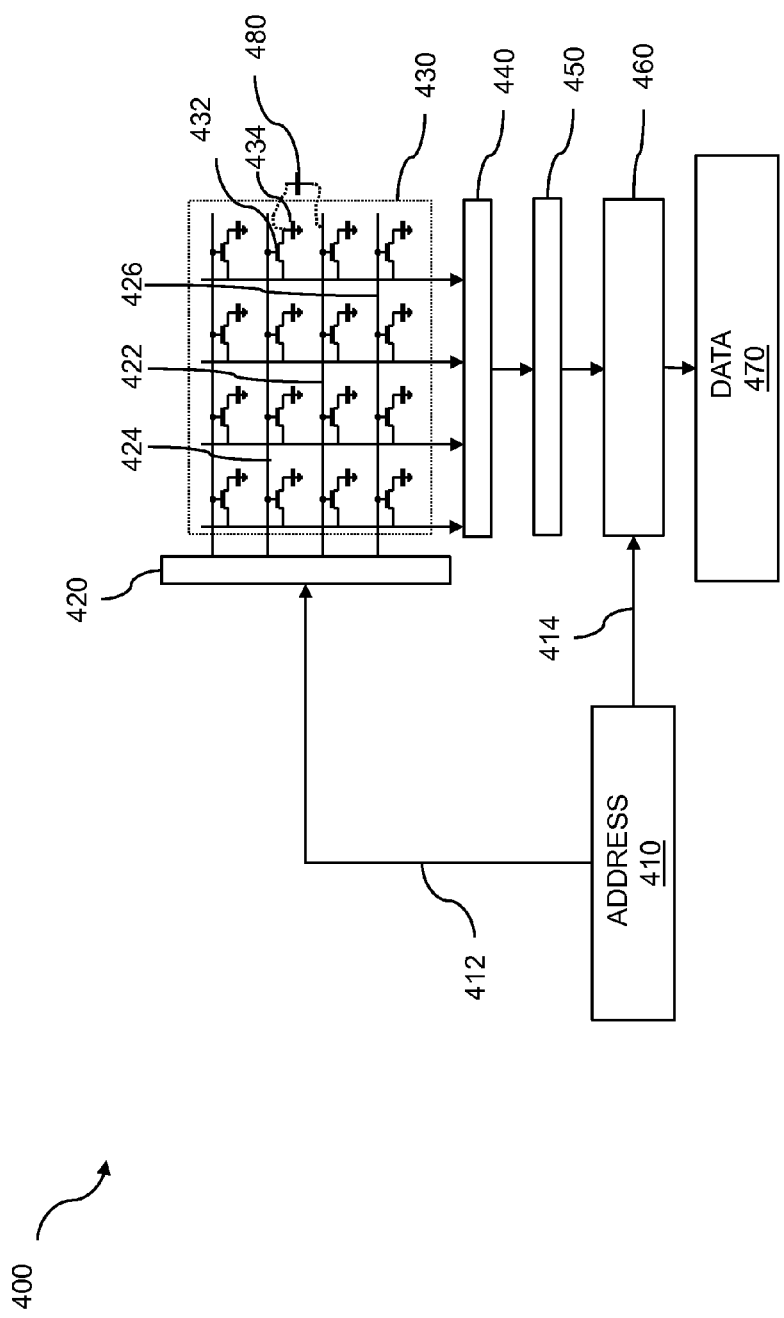
FIG. 4 is an example schematic for DRAM.

FIG. 4 is an example schematic for DRAM 400. The DRAM 400 is a simplified example of the DRAM 320 of FIG. 3. The DRAM 400 includes an address register 410 to store a row address 412 and a column address 414. The row address 412 is coupled to row circuitry 420 to decode/demultiplex the row address and drive multiple row lines 422, 424, 426 across the memory array 430. The example memory array 430 includes 16 memory cells, although most implementations will include many more memory cells in a memory array. Each memory cell includes an access device, such as a field-effect transistor (FET) 432 and a charge storage capacitor 434. When a row, such as aggressor row 422 is activated, the access devices for that row are turned on and the voltage levels of the charge storage capacitors for that row are coupled through column lines to the sense amplifiers 440, which determine what data is stored in the memory cells of that row. The output of the sense amplifiers 440 can be stored in latches 450 and the column select circuitry 460 can use the column address 414 to select one or more of the values stored in the latches 450 to send to the data drivers 470 which provide the data identified by the address register 410.

As the aggressor row 422 is driven, the changing voltage on the aggressor row 422 can couple to the storage capacitor of one or more victim rows. In the example shown, a neighboring row to the aggressor row 422 can be determined to be a victim row 424, and a second neighboring row to the aggressor row 422 can be determined to be a second victim row 426. The second portion of the memory, or victim portion, which is the portion that can be affected by activating an aggressor row 432, includes the first victim row 424 and the second victim row 426. The change in voltage of the aggressor row 422 can couple to the charge storage capacitor 434 by a parasitic capacitance 480. Other electrical coupling between the aggressor row 424 and the memory cells of the victim rows 424 and 426 can exist, depending on the embodiment. While, in embodiment, the one activation of row 422 will not change the amount of charge on the charge storage capacitor 434 by very much, repeated activations of the aggressor row 422 can cause the change to accumulate. If the aggressor row line 422 is activated more than a maximum activation count (nMAC) times, the accumulated change to the charge storage capacitor 434 can be large enough to cause a memory error, referred to as row hammering. The addition of the support logic 340, along with the storage memory 350 and Others register 360 as shown in FIG. 3 can be used to eliminate, or at least drastically reduce, this type of memory error.

Figure 5:
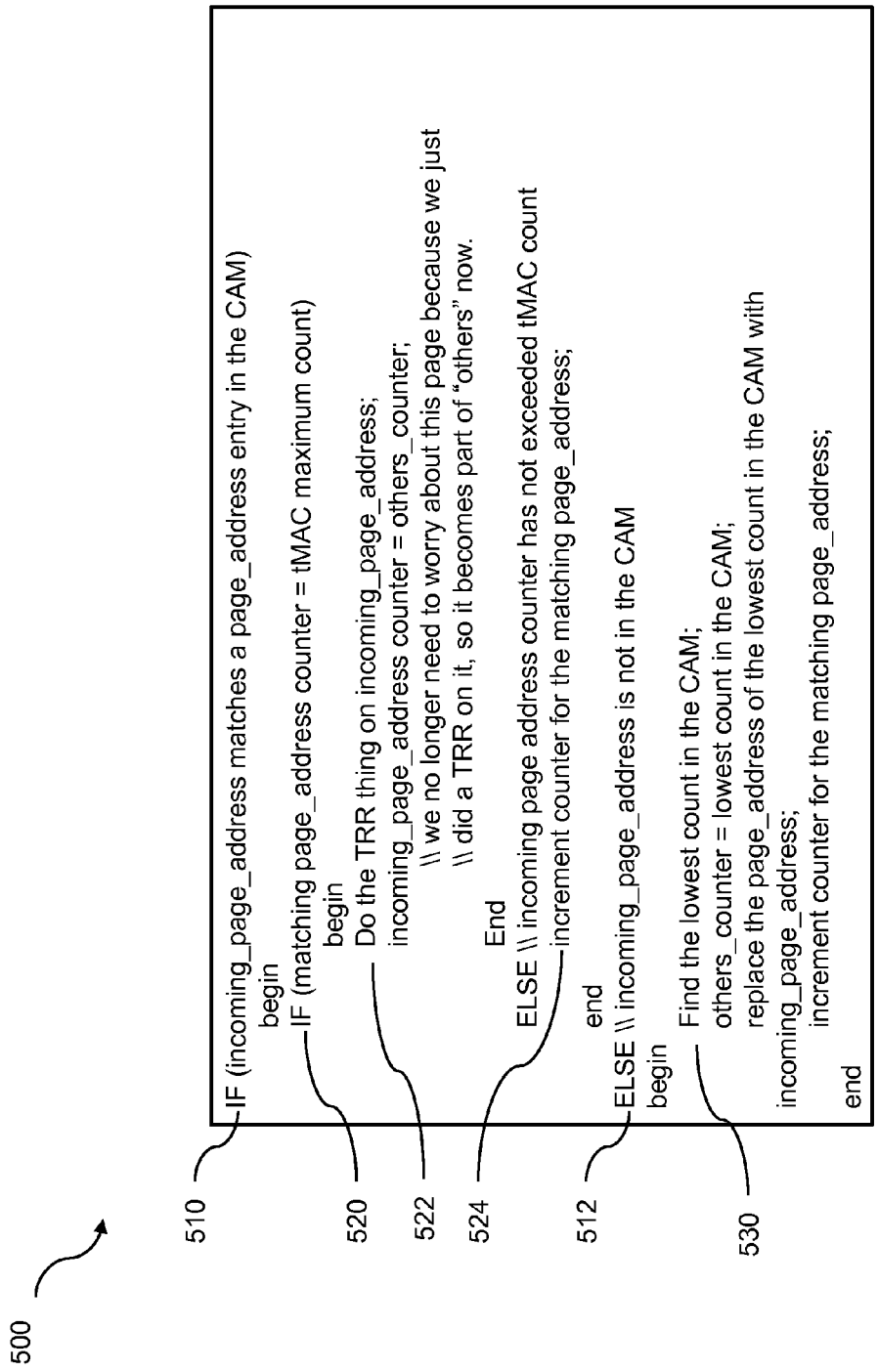
FIG. 5 shows example pseudo code for counting active pages of memory.

FIG. 5 shows example pseudo code 500 for one embodiment of counting active portions of memory. In the example shown, accesses to pages of memory are tracked. While the pseudo code is not meant to conform to any particular programming or hardware description language, it will be well understood by one of ordinary skill in the art to convey the techniques described. An incoming page address is compared to the page address entries in the content addressable memory (CAM) 510. If a match is found, the next line of pseudo code to be evaluated is the next IF statement 520, but if no match is found, the pseudo code branches to the ELSE statement 512.

If a match is found, the counter associated with the stored page address in the CAM that matched is compared to a threshold 520, tMAC in this example, which can be based on nMAC. If the counter matches tMAC, the accessed page is marked for refresh, such as by performing a targeted row refresh (TRR) 522 on the rows of that page. Then the counter associated with that page address in the CAM is set to the value of the Others register. So in this example, the second portion of the memory that is marked for refresh includes the portion of the memory accessed, which is a page of memory. If the counter does not match tMAC, the counter for the incoming page address is incremented 524 and the pseudo code 500 is completed.

If, on the other hand, no match is found for the incoming page address in the CAM, the ELSE statement 512 begins a search for the lowest count value in the CAM 530. Once the lowest count value is found, the Others register is set to that lowest count value, the page address in the CAM associated with that lowest count value is set to the incoming page address, and the count of that CAM entry is incremented to complete the pseudo code 500. In embodiments, the portion of the memory is a page, and the second portion of the memory comprises the portion of the memory.

Other embodiments will use different methods for tracking portions of memory. In some embodiments, accessing an aggressor portion can cause a count to be incremented for one or more victim portions, where a count is maintained for each victim portion instead of each aggressor portion. So one access of an aggressor row could cause multiple searches of the CAM for multiple victim addresses and multiple counts within the CAM could be changed.

In other embodiments, the threshold for the count of number of accesses can be based on nMAC divided by a number of victim rows affected by the aggressor row. In some embodiments, nMAC is a maximum number of aggressor activations that are allowed on a single aggressor portion of memory while in other embodiments, nMAC is a maximum number of aggressor activations that are allowed on all aggressor portions that could impact a single victim portion.

Figure 6:
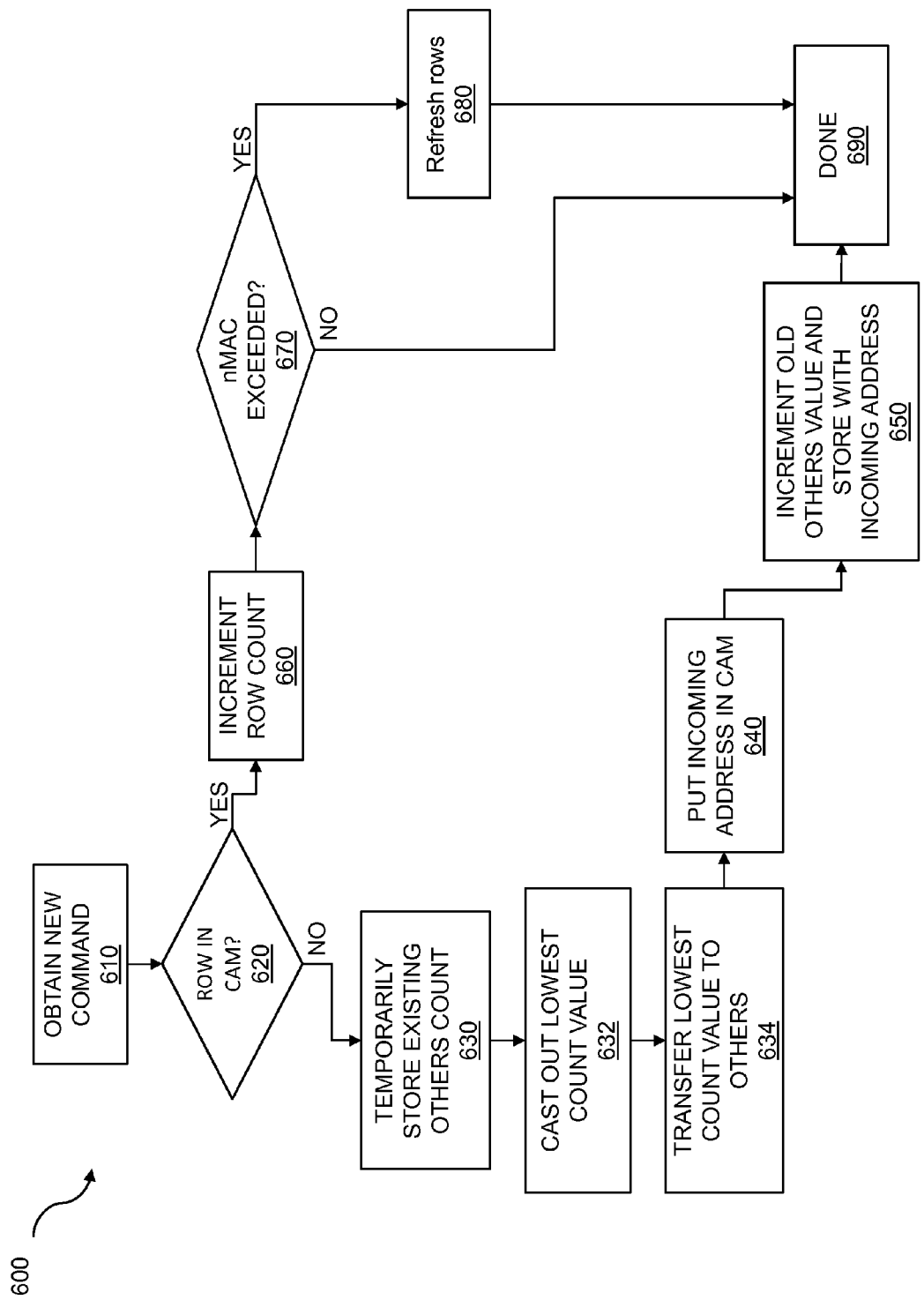
FIG. 6 is a flow diagram for row use.

FIG. 6 is a flow diagram for row use. The flow 600 begins by obtaining a new command 610 to access the memory. A check is made to see if the row address for the command is already in the CAM 620. If the row address is already in the CAM, the row count associated with that row address is incremented 660 and compared to nMAC 670. If nMAC has not been exceeded, the row activation processing for the command is completed 690, but if nMAC has been exceeded, victim rows that are associated with the row address are refreshed 680.

If the row address for the command is not in the CAM, the value in the Others register is temporarily saved 630 and the entry in the CAM with the lowest count value is identified. The lowest count value is cast out of the CAM 632 by transferring the lowest count value to the Others register 634. The incoming row address is stored in the identified CAM entry 640 and the temporarily saved previous value of the Others register is incremented and stored in the identified CAM entry with the incoming address 650. Various steps in the flow 600 may be changed in order, repeated, omitted, or the like without departing from the disclosed concepts.

Figure 7:
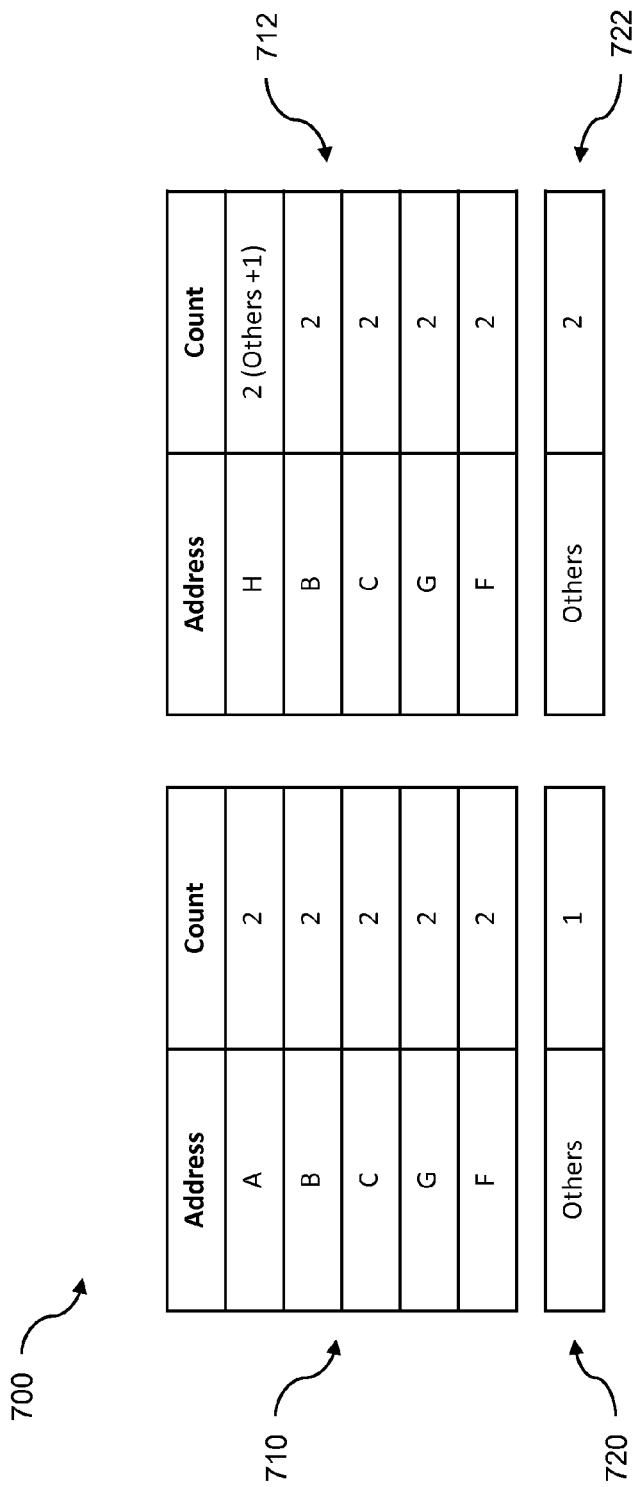
FIG. 7 is an example for swapping address contents.

FIG. 7 is an example for swapping address contents. The example 700 shows two different states of a CAM and Others register. The CAM has five entries, each consisting of an address and a count. The Others register stores a single count value. The CAM in a first state 710 has address A stored with a count of 2, address B stored with a count of 2, address C stored with a count of 2, address G stored with a count of 2, and address F stored with a count of 2. The Others register in the first state 720 has a count value of 1.

The CAM in the second state 712 and the Others register in the second state 722 show the response to an access to address H. Once the access to address H is received, the CAM 710 is searched to find if the address H is stored in the CAM 710. Since the address H is not found, a search of the CAM 710 for the lowest count value is performed. Since all five entries have the same count value of 2, the first entry found to match the lowest count value is selected for replacement. Other embodiments can use various algorithms to select one of the entries having the lowest value for replacement in the event of more than one entry having the lowest value, including, but not limited to, random selection, least recently accessed, or any other algorithm. The address H is stored in the selected first entry of the CAM 712 and the value that had previously been stored in the Others register 720 is incremented and stored in the first entry of the CAM 712. The value of 2 that had previously been stored in the first entry of the CAM 710 is then stored in the Others register 722.

So, the example 700 shows recording a number of times that a portion of a memory is accessed by storing a value that is not less than the actual number of times that the portion of memory has been accessed. The example 700 also shows storing the number of times that the portion is accessed as well as an address for the portion.

Figure 8:
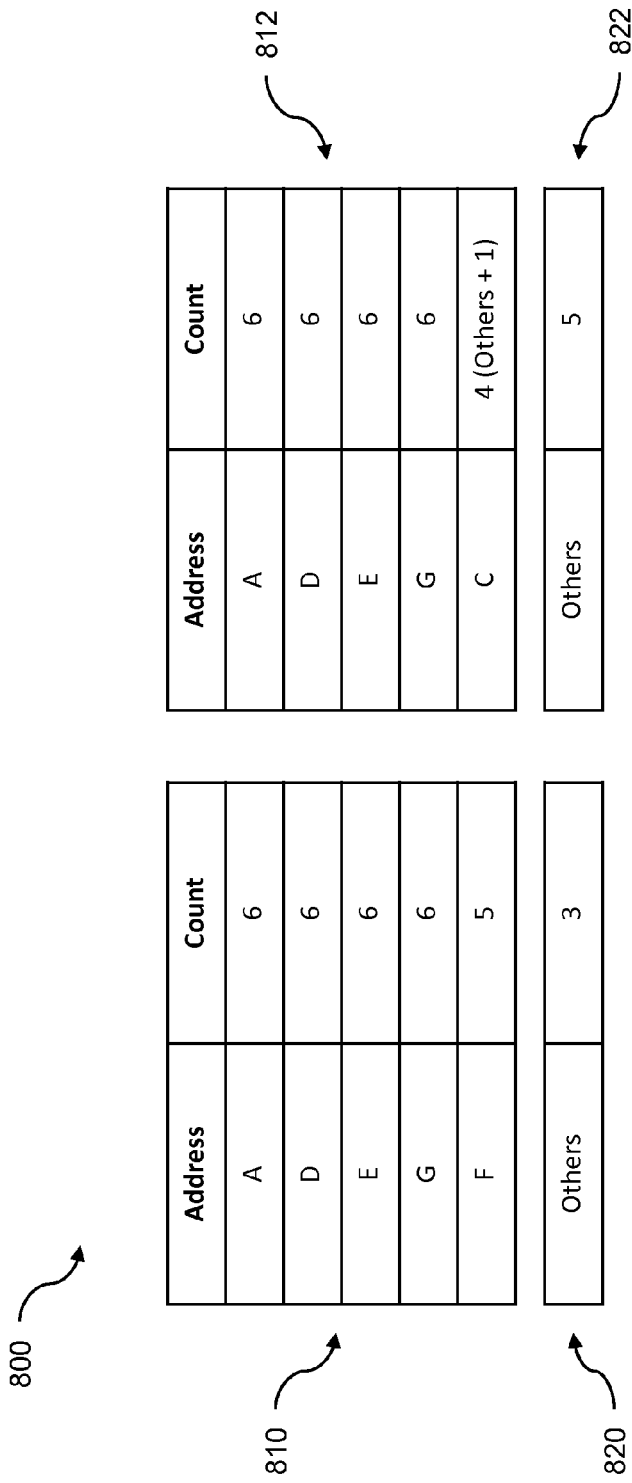
FIG. 8 is an example where others value is different from swapped-out value.

FIG. 8 is an example where the Others value is different from the swapped out value. The example 800 shows two different states of a CAM and Others register. The CAM has five entries, each consisting of an address and a count. The Others register stores a single count value. The CAM in a first state 810 has address A stored with a count of 6, address D stored with a count of 6, address E stored with a count of 6, address G stored with a count of 6, and address F stored with a count of 5. The Others register in the first state 820 has a count value of 3. The CAM 810 in the first state can be representative of the same CAM as shown in FIG. 7, but after several more accesses.

The CAM in the second state 812 and the Others register in the second state 822 show the response to an access to address C. Once the access to address C is received, the CAM 810 is searched to find if the address C is stored in the CAM 810. Since the address C is not found, a search of the CAM 810 for the lowest count value is performed and the fifth entry F is identified as having the lowest count value. The address C is stored in the selected fifth entry F of the CAM 812, and the value that had previously been stored in the Others register 820 is incremented from 3 to 4 and stored in the fifth entry of the CAM 812. The value of 5 that had previously been stored in the fifth entry of the CAM 810 is then stored in the Others register 822.

Figure 9:
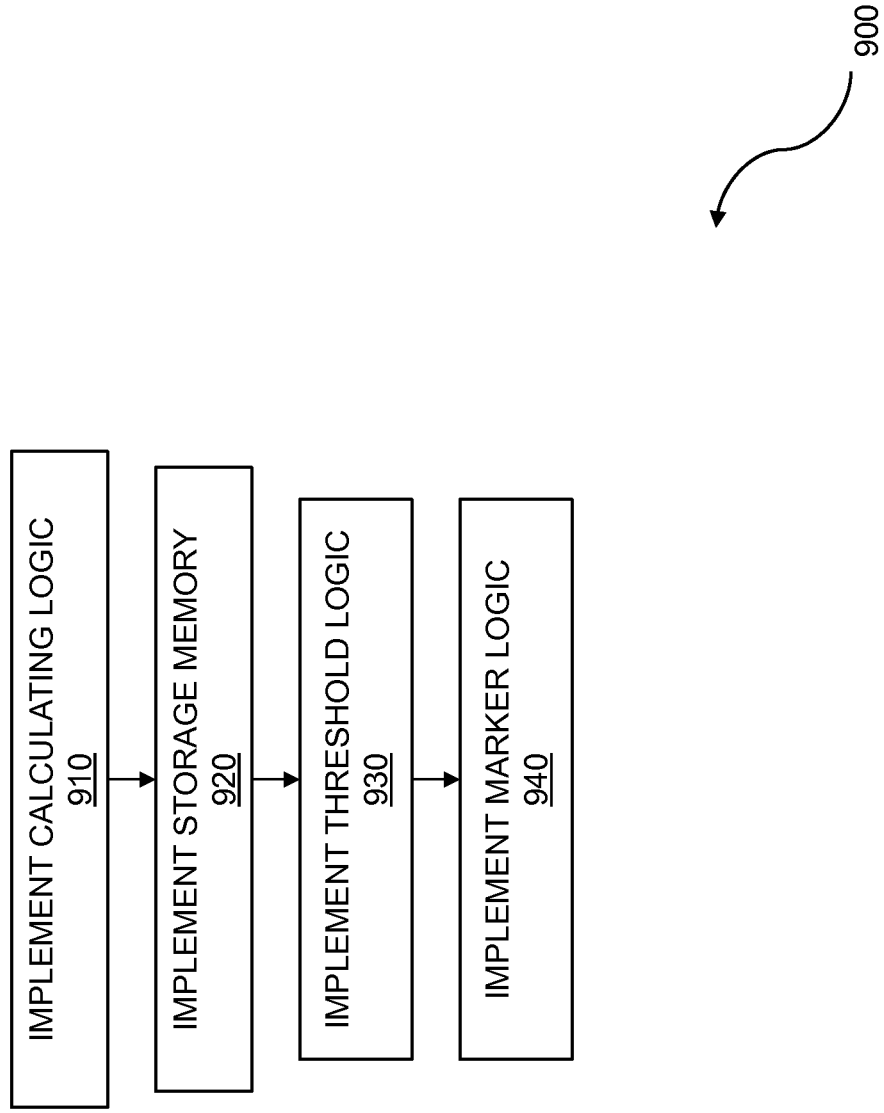
FIG. 9 is a flow diagram for design automation for activation tracking.

FIG. 9 is a flow for design automation for activation tracking. The flow 900 describes a computer program product embodied in a non-transitory computer readable medium for implementing an apparatus for activation tracking. The computer program product can be used to generate a circuit description for an electronic circuit for activation tracking from a design description. The design description can be any type of design description including, but not limited to a functional description or a register transfer description written in a hardware description language such as SystemVerilog™. The circuit description can be various types of circuit description including, but not limited to, a netlist, a synthesizable gate level description, or a set of masks. The generated circuit description can be used in conjunction with a memory array and a memory controller. In some embodiments, the circuit description for the electronic circuit for activation tracking can be integrated with circuit descriptions for the memory array and memory controller to fabricate an integrated circuit that acts a memory device and includes the ability to track accesses to portions of the memory array and take action to avoid memory corruption due to repeated accesses to a portion of the memory array.

The flow 900 includes code for implementing calculating logic 910 for determining a number of times that a portion of a memory has been accessed. The portion of the memory tracked can be a page, a row, or any other portion of the memory array, depending on the embodiment. The flow 900 also includes code for implementing storage memory 920, coupled to the calculating logic, for storing the number of times that the portion of a memory has been accessed as well as an address for the portion. The flow 900 also includes code for implementing threshold logic 930, coupled to the calculating logic, for determining that the number of times that the portion is accessed exceeds a certain threshold. The certain threshold used depends on the embodiment but is based on a maximum activation count in at least some embodiments. The flow 900 also includes code for implementing marking logic 940 coupled to the calculating logic for defining that the second portion of the memory needs refresh, based on the number exceeding the certain threshold. The marking logic can take any action to restore the proper charge in a capacitor of a storage element in the second portion of the memory. Various steps in the flow 900 may be changed in order, repeated, omitted, or the like without departing from the disclosed concepts. Various embodiments of the flow 900 may be included in a computer program product embodied in a non-transitory computer readable medium that includes code executable by one or more processors.

Figure 10:
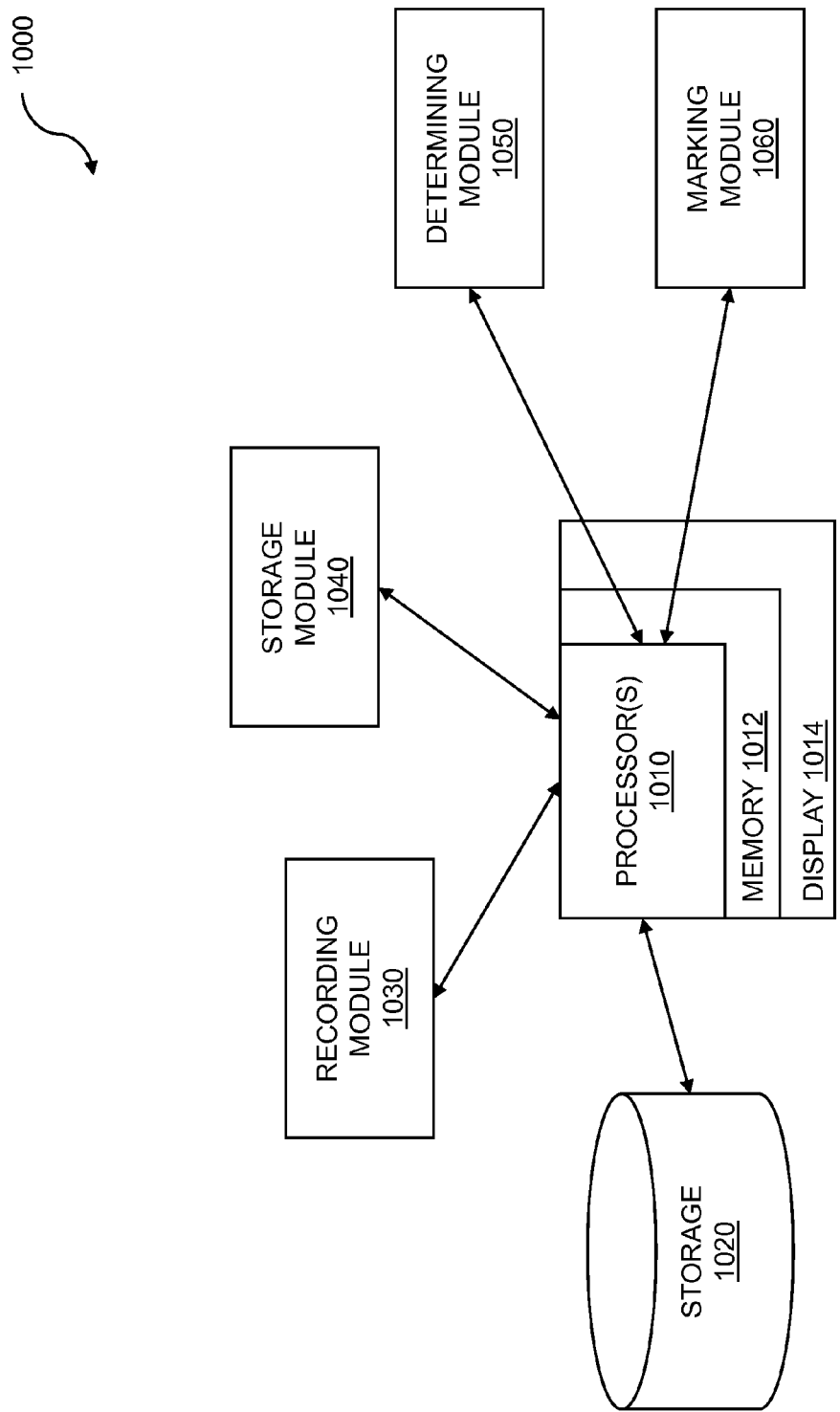
FIG. 10 is a system diagram for activation tracking circuit generation.

FIG. 10 is a system diagram for activation tracking circuit generation. The example system 1000 includes one or more processors 1010 coupled to memory 1012 which can be used to store computer code instructions and/or data, design descriptions, circuit descriptions, computer code of electronic design automation programs, intermediate data, and the like. A display 1014 is also included in some embodiments, and can be any electronic display, including but not limited to, a computer display, a laptop screen, a net-book screen, a tablet screen, a cell phone display, a mobile device display, a remote with a display, a television, a projector, or the like. Storage 1020, which can be used for numerous purposes, including storage of computer programs, design descriptions, and circuit descriptions, is coupled to the one or more processors 1010 and comprises one or more of a computer disk or other computer storage medium. A computer program running on the one or more processors 1010 can perform activation tracking circuit generation. A recording module 1030 can be included in the system 1000 to implement calculating logic for determining a number of times that a portion of a memory has been accessed. A storage module 1040 can be included in the system 1000 to implement storage memory, coupled to the calculating logic, for storing the number of times that the portion of a memory has been accessed as well as an address for the portion. A determining module 1050 is included in the system 1000 to implement threshold logic, coupled to the calculating logic, for determining that the number of times that the portion is accessed exceeds a certain threshold. A marking module 1060 can also be included in the system 1000 to implement marking logic, coupled to the calculating logic, for defining that a second portion of the memory needs refresh, based on the number exceeding the certain threshold. In at least one embodiment, the functions of the recording module 1030, the storage module 1040, the determining module 1050, and the marking module 1060, are accomplished or augmented by the one or more processors 1010.

The system 1000 can include a computer program product embodied in a non-transitory computer readable medium, such as storage 1020, for implementing an apparatus for activation tracking comprising: code for implementing calculating logic for determining a number of times that a portion of a memory has been accessed; code for implementing storage memory, coupled to the calculating logic, for storing the number of times that the portion of a memory has been accessed as well as an address for the portion; code for implementing threshold logic, coupled to the calculating logic, for determining that the number of times that the portion is accessed exceeds a certain threshold; and code for implementing marking logic, coupled to the calculating logic, for defining that the second portion of the memory needs refresh, based on the number exceeding the certain threshold.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JAVASCRIPT™, ACTIONSCRIPT™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. An apparatus for activation tracking comprising:
   calculating logic configured to determine a number of times that a portion of a memory has been accessed;
   storage memory, coupled to the calculating logic, configured to store the number of times that the portion of a memory has been accessed as well as an address for the portion, wherein the number of times and the address are cast out in response to where sufficient other portions have been accessed more times;
   an others register configured to store a value representing a maximum number of times that any address which is not stored in the storage memory has been accessed;
   threshold logic, coupled to the calculating logic, configured to determine that the number of times that the portion is accessed exceeds a certain threshold; and
   marking logic, coupled to the calculating logic, configured to define that a second portion of the memory needs refresh, based on the number of times exceeding the certain threshold.

2. The apparatus of claim 1 wherein the storage memory has fewer entries than a number of row addresses for the memory.

3. The apparatus of claim 1 wherein the calculating logic uses a value stored in the storage memory and increments the value.

4. The apparatus of claim 3 wherein the value that was incremented is stored in the storage memory for the number of times that the portion has been accessed.

5. The apparatus of claim 1 wherein the number of times is reset in response to the second portion of the memory being refreshed.

6. The apparatus of claim 1 wherein the portion of the memory is a page, and the second portion of the memory comprises the portion of the memory.

7. The apparatus of claim 1 wherein the portion of the memory is a row.

8. The apparatus of claim 7 wherein the memory comprises a dynamic random access memory.

9. The apparatus of claim 8 wherein the storage memory comprises a content addressable memory.

10. The apparatus of claim 7 wherein the row is determined to be an aggressor row.

11. The apparatus of claim 10 wherein a neighboring row to the aggressor row is determined to be a victim row, wherein the second portion of the memory comprises the victim row.

12. The apparatus of claim 10 wherein a second neighboring row to the aggressor row is determined to be a second victim row, wherein the second portion of the memory also comprises the second victim row.

13. The apparatus of claim 1 wherein the storage memory is further configured into a count storage portion where the number of accesses is stored and a corresponding address storage portion where the address associated with the count is stored.

14. The apparatus of claim 13 wherein the calculating logic is further configured to reset a number stored in count storage and associated with an aggressor row address stored in address storage in response to the second portion of the memory being refreshed in response to action by the marking logic.

15. The apparatus of claim 1 wherein the storage memory is further configured to cast out a number and address by the calculating logic in response to other portions being accessed more times.

16. A method for activation tracking comprising:
    recording a number of times that a portion of a memory is accessed;
    storing the number of times that the portion is accessed as well as an address for the portion;
    determining that the number of times that the portion is accessed exceeds a certain threshold;
    storing an others value where the others value describes a number of times that other portions of the memory have been accessed where addresses for those other portions are not stored;
    casting out the address in response to sufficient other portions having been accessed more times; and
    marking a second portion of the memory for refresh based on the number of times exceeding the certain threshold.

17. The method of claim 16 further comprising resetting the number of times in response to the second portion of the memory being refreshed.

18. The method of claim 16 wherein the portion of the memory is a page, and the second portion of the memory comprises the portion of the memory.

19. The method of claim 16 wherein the portion of the memory is a row.

20. The method of claim 19 wherein the memory is a dynamic random access memory.

21. The method of claim 20 wherein the storing is accomplished with a content addressable memory.

22. The method of claim 19 wherein the row is determined to be an aggressor row.

23. The method of claim 22 wherein a neighboring row to the aggressor row is determined to be a victim row, wherein the second portion of the memory comprises the victim row.

24. The method of claim 23 wherein a second neighboring row to the aggressor row is determined to be a second victim row, wherein the second portion of the memory also comprises the second victim row.

25. The method of claim 16 wherein the storage memory is further configured into a count storage portion where the number of accesses is stored and a corresponding address storage portion where the address associated with the count is stored.

26. The method of claim 25 further comprising resetting a number stored in count storage and associated with an aggressor row address stored in address storage in response to the second portion of the memory being refreshed in response to action by the marking logic.

27. A computer program product embodied in a non-transitory computer readable medium for implementing an apparatus for activation tracking comprising:
    code for implementing calculating logic configured to determine a number of times that a portion of a memory has been accessed;
    code for implementing storage memory, coupled to the calculating logic, configured to store the number of times that the portion of a memory has been accessed as well as an address for the portion, wherein the number of times and the address are cast out in response to where sufficient other portions have been accessed more times;

code for implementing an others register, where the others register value describes a number of times that other portions of the memory have been accessed where addresses for those other portions are not stored;

code for implementing threshold logic, coupled to the calculating logic, configured to determine that the number of times that the portion is accessed exceeds a certain threshold; and code for implementing marking logic, coupled to the calculating logic, configured to define that a second portion of the memory needs refresh, based on the number of times exceeding the certain threshold.

28. A computer program product embodied in a non-transitory computer readable medium comprising:

code for generating an activation tracking circuit comprising:

a first module configured to determine cumulative access to each of a first plurality of memory locations and to a second plurality of memory locations wherein the first module retains an address for each of the first plurality of memory locations and wherein a number of times, that other portions of the memory have been accessed where addresses for those other portions are not retained, is stored; and a second module configured to take action to avoid corruption of a selected portion of memory, by casting out an address in response to sufficient other portions having been accessed more times, when a cumulative number of accesses to at least one of the first plurality of memory locations exceeds a threshold.

29. The computer program product of claim 28 wherein the first plurality of memory locations comprise the most activated portion of memory and the most recently accessed memory location.

30. The computer program product of claim 28 wherein the first module further comprises a CAM for storing a limited number of the memory locations.

31. The computer program product of claim 28 wherein the generating the activation circuit is in conjunction with generating a memory array.

32. The computer program product of claim 28 wherein the generating the activation circuit is in conjunction with generating a memory controller.

* * * * *